(12) United States Patent
Blank

(10) Patent No.: US 11,362,184 B2
(45) Date of Patent: Jun. 14, 2022

(54) CONTACT STRUCTURE FOR POWER SEMICONDUCTOR DEVICES

(71) Applicant: Infineon Technologies Austria AG, Villach (AT)

(72) Inventor: Oliver Blank, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/912,081

(22) Filed: Jun. 25, 2020

(65) Prior Publication Data

US 2021/0408243 A1    Dec. 30, 2021

(51) Int. Cl.
*H01L 29/40* (2006.01)
*H01L 29/10* (2006.01)
*H01L 29/423* (2006.01)
*H01L 29/78* (2006.01)

(52) U.S. Cl.
CPC ........ *H01L 29/404* (2013.01); *H01L 29/1095* (2013.01); *H01L 29/407* (2013.01); *H01L 29/42336* (2013.01); *H01L 29/7813* (2013.01)

(58) Field of Classification Search
CPC . H01L 29/404; H01L 29/1095; H01L 29/407; H01L 29/42336; H01L 29/7813
USPC ....................................................... 257/330
See application file for complete search history.

(56) References Cited

U.S. PATENT DOCUMENTS

| | | |
|---|---|---|
| 2009/0026535 A1 | 1/2009 | Matsuura et al. |
| 2014/0097431 A1* | 4/2014 | Zundel ................... H01L 22/14 257/48 |
| 2014/0264577 A1* | 9/2014 | Rieger ................ H01L 27/0922 257/337 |
| 2014/0374882 A1* | 12/2014 | Siemieniec .......... H01L 21/324 257/618 |
| 2020/0083366 A1 | 3/2020 | Venkatraman et al. |
| 2021/0320200 A1* | 10/2021 | Saxena ................. H01L 29/063 |

* cited by examiner

*Primary Examiner* — Mohammad M Hoque
(74) *Attorney, Agent, or Firm* — Murphy, Bilak & Homiller, PLLC

(57) ABSTRACT

A transistor device includes field plate contacts that electrically connect overlying contact pads to field electrodes in underlying trenches, and mesa contacts that electrically connect the contact pads to semiconductor mesas confined by the trenches. Each field plate contact is divided into field plate contact segments that are separated from one another. Each mesa contact is divided into mesa contact segments that are separated from one another. In a first area adjacent to an end of the trenches, a first line that runs perpendicular to the trenches intersects a first field plate contact segment of the field plate contacts and a first mesa contact segment of the mesa contacts. In a second area spaced inward from the first area, a second line that runs perpendicular to the trenches intersects a second field plate contact segment of the field plate contacts and a second mesa contact segment of the mesa contacts.

21 Claims, 3 Drawing Sheets

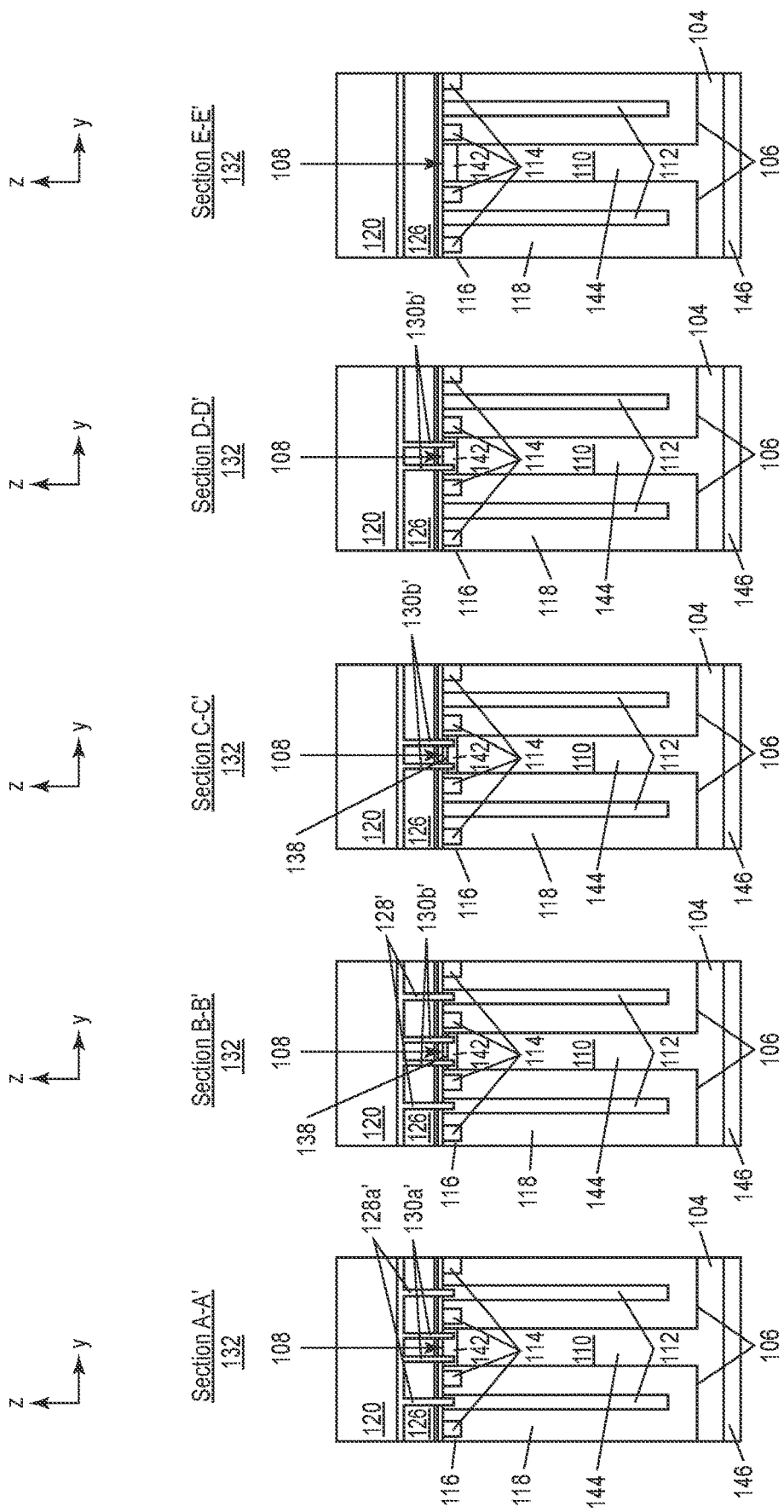

CONTACT STRUCTURE FOR POWER SEMICONDUCTOR DEVICES

BACKGROUND

The final (power) metallization layer of a power semiconductor device is typically segmented into a plurality of contact pads. The contacts pads provide a power (source/emitter) terminal connection to the power semiconductor device. After wire bonding to the contact pads, a treatment is often applied to improve mold compound adhesion. Depending on the chemistry of the adhesion promotion treatment, problematic contaminants such as sodium may deposit on the final metallization layer and a passivation layer which may be present. Before the contaminants can be removed from the final metallization layer and passivation layer, the contaminants may enter cracks in the final metallization layer. Cracks may arise in the final metallization layer during the wire bonding process if the underlying layers (e.g. a contact plug layer embedded in borophosphosilicate glass, commonly known as BPSG) are moving due to the stress by the bonding process. From these entry points, the contaminants can enter the underlying oxide within a weak point of the barrier (e.g. Ti/TiN/W) for the final metallization layer. Electrical failure may result from such contamination, e.g., due to drift in the transfer characteristic of the power transistor.

Thus, there is a need for an improved contact structure for power semiconductor devices.

SUMMARY

According to an embodiment of a transistor device, the transistor device comprises: a semiconductor substrate having a first surface; a plurality of trenches in the semiconductor substrate and extending lengthwise in parallel with one another in a first direction parallel to the first surface such that each pair of adjacent trenches confines a semiconductor mesa; a field electrode and a gate electrode disposed in each of the trenches; a final metallization layer above the semiconductor substrate and segmented into a plurality of contact pads; a plurality of field plate contacts extending lengthwise in parallel with one another in the first direction and electrically connecting the contact pads to the field electrodes; and a plurality of mesa contacts extending lengthwise in parallel with one another in the first direction and electrically connecting the contact pads to the semiconductor mesas, wherein the field plate contacts are each divided along the length of the trenches into a plurality of field plate contact segments that are separated from one another, wherein the mesa contacts are each divided along the length of the trenches into a plurality of mesa contact segments that are separated from one another, wherein in a first area adjacent to an end of the trenches, a first line that runs perpendicular to the trenches intersects a first field plate contact segment of the field plate contacts and a first mesa contact segment of the mesa contacts, wherein in a second area spaced inward from the first area, a second line that runs perpendicular to the trenches intersects a second field plate contact segment of the field plate contacts and a second mesa contact segment of the mesa contacts.

According to an embodiment of a method of producing a transistor device, the method comprises: forming a plurality of trenches in a semiconductor substrate and extending lengthwise in parallel with one another in a first direction parallel to a first surface of the semiconductor substrate such that each pair of adjacent trenches confines a semiconductor mesa; forming a field electrode and a gate electrode in each of the trenches; forming a final metallization layer above the semiconductor substrate and segmented into a plurality of contact pads; forming a plurality of field plate contacts that extend lengthwise in parallel with one another in the first direction and electrically connect the contact pads to the field electrodes; and forming a plurality of mesa contacts that extend lengthwise in parallel with one another in the first direction and electrically connect the contact pads to the semiconductor mesas, wherein forming the plurality of field plate contacts comprises dividing each field plate contact along the length of the trenches into a plurality of field plate contact segments that are separated from one another, wherein forming the plurality of mesa contacts comprises dividing each mesa contact along the length of the trenches into a plurality of mesa contact segments that are separated from one another, wherein in a first area adjacent to an end of the trenches, a first line that runs perpendicular to the trenches intersects a first field plate contact segment of the field plate contacts and a first mesa contact segment of the mesa contacts, wherein in a second area spaced inward from the first area, a second line that runs perpendicular to the trenches intersects a second field plate contact segment of the field plate contacts and a second mesa contact segment of the mesa contacts.

According to another embodiment of a transistor device, the transistor device comprises: a semiconductor substrate having a first surface; a plurality of trenches in the semiconductor substrate and extending lengthwise in parallel with one another in a first direction parallel to the first surface such that each pair of adjacent trenches confines a semiconductor mesa; a field electrode and a gate electrode disposed in each of the trenches; a final metallization layer above the semiconductor substrate and segmented into a plurality of contact pads; a plurality of field plate contacts extending lengthwise in parallel with one another in the first direction and electrically connecting the contact pads to the field electrodes; and a plurality of mesa contacts extending lengthwise in parallel with one another in the first direction and electrically connecting the contact pads to the semiconductor mesas, wherein the field plate contacts are each divided along the length of the trenches into a plurality of field plate contact segments that are separated from one another, wherein in a first area adjacent to an end of the trenches, a first line that runs perpendicular to the trenches intersects a first field plate contact segment of the field plate contacts, wherein in a second area spaced inward from the first area, a second line that runs perpendicular to the trenches intersects a second field plate contact segment of the field plate contacts.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3 through 7 illustrate cross-sectional views taken along the lines labelled A-A' through E-E' in FIG. 2, respectively.

DETAILED DESCRIPTION

The embodiments described herein provide a power semiconductor device having semiconductor mesa and field plate contacts that are interrupted along the length of the gate trenches. By interrupting the semiconductor mesa and field plate contacts along the length of the gate trenches, movement of the insulating layer which surrounds the contact layer is reduced during wire bonding. Less movement by the insulating layer which underlies the final (power) metallization reduces the likelihood of cracks forming in the final metallization layer during the wire bonding process. With fewer cracks in the final metallization layer, contaminants introduced by a treatment for improving mold compound adhesion are less likely to diffuse beyond the final metallization layer. In the case of a power transistor device, the source (emitter) implantation also may be interrupted or omitted in areas without a mesa contact, to avoid latch up during avalanche. Described next is an embodiment of the power semiconductor device.

Figure 1:
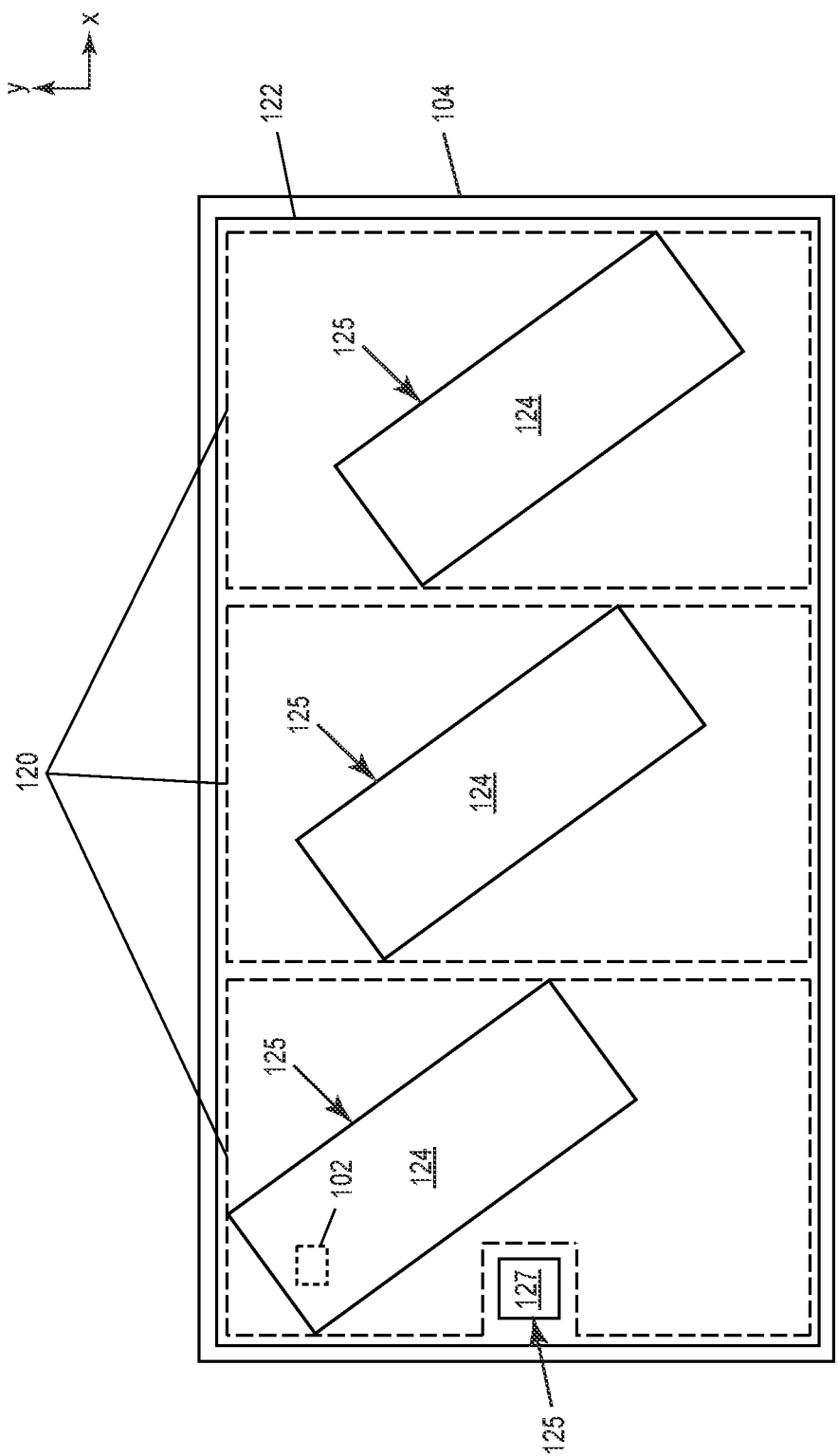
FIG. 1 illustrates a plan view of a power semiconductor device.
Figure 2:
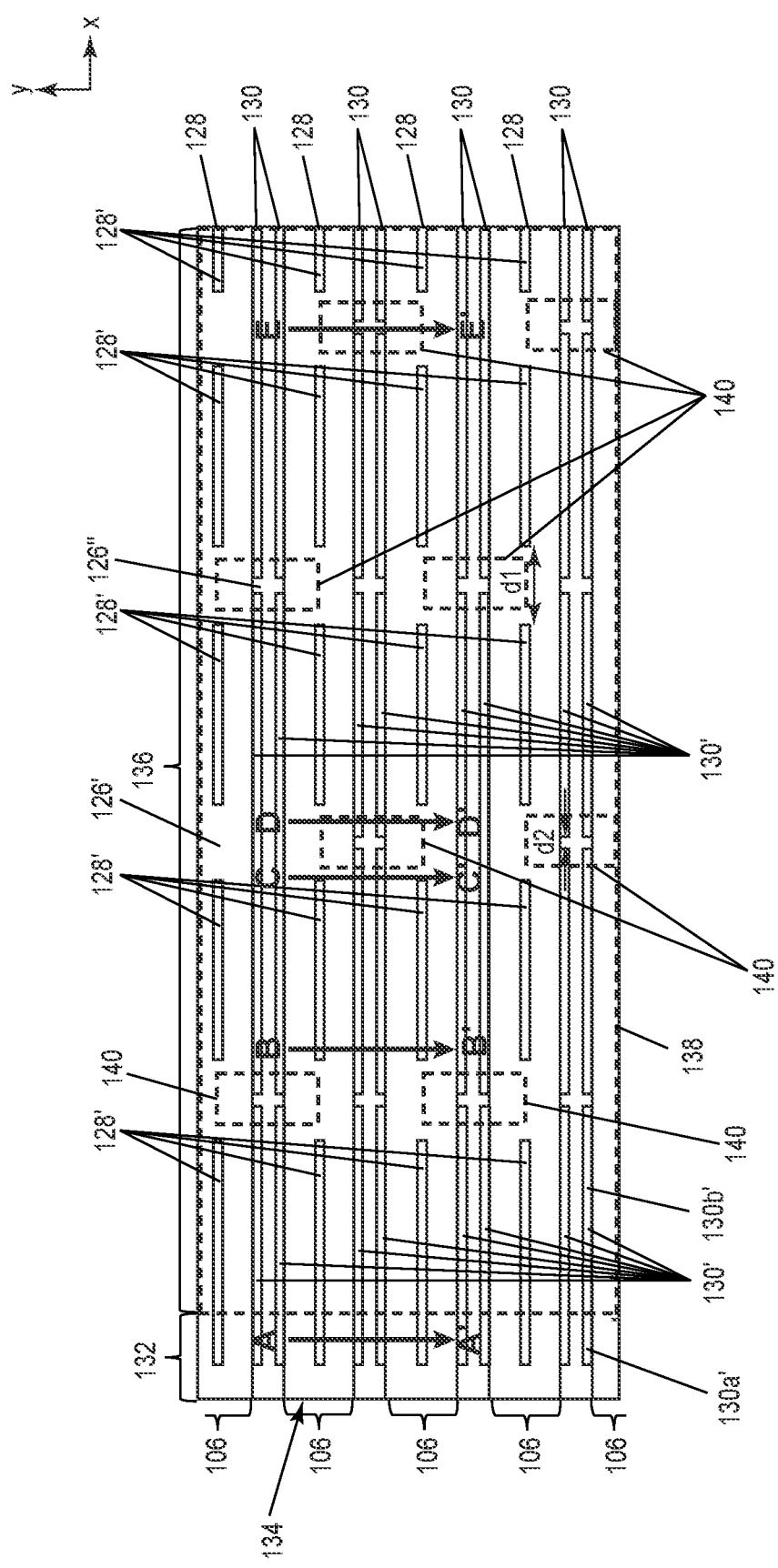
FIG. 2 illustrates a plan view of the region of the power transistor device included in the dashed box labelled 102 in FIG. 1, with the final (power) metallization layer being hidden from view so that the underlying filed plate and semiconductor mesa contact structure is visible.

FIG. 1 illustrates a plan view of a power semiconductor device 100. FIG. 2 illustrates a plan view of the region of the power transistor device 100 included in the dashed box 102 in FIG. 1, with the final (power) metallization layer being hidden from view so that the underlying filed plate and semiconductor mesa contact structure is visible. FIGS. 3 through 7 illustrate cross-sectional views taken along the lines labelled A-A' through E-E' in FIG. 2, respectively.

The power semiconductor device 100 is explained in the context of a power MOSFET (metal-oxide-semiconductor field-effect transistor) in that reference is made to source, body and drain regions. However, the power semiconductor device 100 may instead be an IGBT (insulated gate bipolar transistor) or other type of power transistor device. Accordingly, details relating to the type of device are discussed only briefly. Emphasis instead is placed on a contact structure which increases the mechanical stability of the insulating layer just below the final (top) metallization layer of the device.

The power semiconductor device 100 includes a semiconductor substrate 104. The semiconductor substrate 104 may comprise any type of semiconductor material suitable for power devices such as power transistors and power diodes. For example, the semiconductor substrate 104 may comprise Si, SiC, GaN, etc. The semiconductor substrate 104 may include a base semiconductor and one or more epitaxial layers grown on the base semiconductor.

The power semiconductor device 100 also includes trenches 106 formed in the semiconductor substrate 104, e.g., by etching. The trenches 106 extend lengthwise in parallel with one another in a direction (x-direction in FIGS. 1 and 2) that is parallel to a main surface 108 of the semiconductor substrate 104 in which the trenches 106 are formed, such that each pair of adjacent trenches 106 confines a semiconductor mesa 110. Directions 'x' and 'y' in FIGS. 1 and 2 are lateral (horizontal) directions which run perpendicular to one another and parallel to the main surface 108 of the semiconductor substrate 104, whereas direction 'z' in FIGS. 3 through 7 is a vertical direction which runs perpendicular to the main surface 108 of the semiconductor substrate 104.

A field electrode 112 and one or more gate electrodes 114 are disposed in each of the trenches 106. Each gate electrode 114 is insulated from the surrounding semiconductor material by a gate dielectric 116. Each field electrode 112 is insulated from the gate electrode(s) in the same trench 106 and from the surrounding semiconductor material by a field dielectric 118 which may be of the same material as the gate dielectric 116 or a different insulative material. The field electrodes 112 may be biased at source potential, another potential, or floating.

A final (power) metallization layer 120 is formed above the semiconductor substrate 104. A passivation layer 122 such as silicon nitride may be formed on the final metallization layer 120. The passivation layer 122 may comprise silicon nitride and/or imide and/or silicon oxide. The final metallization layer 120, which may be a Cu layer, Al layer, AlCu, layer, etc., is segmented into a plurality of contact pads 124. The segmented final metallization layer 120 is covered by the passivation layer 122 and therefore illustrated as dashed rectangles in FIG. 1. The contact pads 124 are defined by openings 125 in the passivation layer 122. A gate pad 127 also may be defined by one of the openings 125 in the passivation layer 122. The contact pads 124 may extend lengthwise in parallel with one another in the same direction (x-direction in FIGS. 1 and 2) as the trenches 106, e.g., as shown in FIG. 1. The contact pads 124 may instead extend lengthwise in parallel with one another in a direction transverse to the trenches 106, e.g., as shown in FIG. 1. Still other contact pad configurations are possible. In the case of a power transistor device as shown in FIGS. 1 through 7, the contact pads 124 provide a power (e.g. source or emitter) terminal connection to the power semiconductor device 100. Electrical conductors (not shown) such as bond wires, metal ribbons, a metal clip, etc. are attached to the contact pads 124 to provide external electrical connection to the power semiconductor device 100.

The final metallization layer 120 of the power semiconductor device 100 is disposed on an insulating layer 126 that comprises an electrically insulative material such as BPSG. The power semiconductor device 100 may include more than one metallization layer with an interlayer dielectric separating the metallization layers, with the metallization layer 120 shown in FIGS. 1 through 7 being the uppermost one.

Field plate contacts 128 extend lengthwise in parallel with one another in the same direction (x-direction in FIGS. 1 and 2) as the trenches 106, e.g., as shown in FIG. 2. The field plate contacts 128 also extend in the vertical direction (z-direction in FIGS. 3 through 7) and electrically connect the overlying contact pads 124 of the final metallization layer 120 to the underlying field electrodes 112 disposed in the trenches 106. The field plate contacts 128 are each divided along the length of the trenches 106 into a plurality of field plate contact segments 128' that are separated from one another.

Mesa contacts 130 which form part of the same vertical interconnect layer that includes the field plate contacts 128 extend lengthwise in parallel with one another in the same direction (x-direction in FIGS. 1 and 2) as the trenches 106, e.g., as shown in FIG. 2. The mesa contacts 130 also extend in the vertical direction (z-direction in FIGS. 3 through 7) and electrically connect the overlying contact pads 124 of the final metallization layer 120 to the underlying semiconductor mesas 110. The mesa contacts 130 are each divided along the length of the trenches 106 into a plurality of mesa contact segments 130' that are separated from one another. In one embodiment, the field plate contacts 128 and the mesa contacts 130 comprise polysilicon. In another embodiment, the field plate contacts 128 and the mesa contacts 130 comprise one or more metals or metal alloys.

In one embodiment, the field plate contact segments 128' of the same field plate contact 128 are separated from one another by first bridging regions 126' of the uppermost insulating layer 126 and the mesa contact segments 130' of the same mesa contact 130 are separated from one another by second bridging regions 126" of the uppermost insulating layer 126. The first bridging regions 126' of the uppermost insulating layer 126 (between adjacent field plate contact segments 128' of the same field plate contact 128) are wider than the second bridging regions 126" of the uppermost insulating layer 126 (between adjacent mesa contact segments 130' of the same mesa contact 130). Accordingly, the field plate contact segments 128' of the same field plate contact 128 are separated from one another by a first distance d1 measured along the length (x-direction in FIGS. 1 and 2) of the trenches 106. The mesa contact segments 130' of the same mesa contact 130 are separated from one another by a second distance d2 which is measured in the same direction as the first distance d1 and smaller than d1.

According to one embodiment of segmenting the field plate contacts 128 and the mesa contacts 130, the uppermost insulating layer 126 (e.g. BPSG) is deposited over the main surface 108 of the semiconductor substrate 104 after formation of the trenches 106 and device regions in the semiconductor mesas 110 confined by the trenches 106. A lithography mask (not shown) is then formed on the uppermost insulating layer 126. The lithography mask defines locations of each field plate contact 128 and each mesa contact 130 and also locations where each contact 128, 130 is to be etched and thus divided into multiple spaced-apart segments 128', 130' along the length of the trenches 106. The uppermost insulating layer 126 is then patterned, e.g., by etching using the lithography mask to define the locations of the field plate contacts 128 and the mesa contacts 130 (where the uppermost insulating layer 126 has been removed), and also the locations of the bridging regions 126', 126" of the uppermost insulating layer 126 where the uppermost insulating layer 126 has not been etched. An electrically conductive material such as polysilicon or a metal/metal alloy is deposited on the patterned uppermost insulating layer 126 and then etched or planarized to form the segmented field plate contacts 128 and the segmented mesa contacts 130. For example, a Ti/TiN/W layer stack may be deposited and then etched or planarized to form the segmented field plate contacts 128 and the segmented mesa contacts 130.

As shown in FIG. 2, the first bridging regions 126' of the uppermost insulating layer 126 separate adjacent field plate contact segments 128' of the same field plate contact 128 along the length (x-direction in FIGS. 1 and 2) of the trenches 106 and the second bridging regions 126" of the uppermost insulating layer 126 separate adjacent mesa contact segments 130' of the same mesa contact 130 along the length of the trenches 106. As shown in FIGS. 2 and 7, the insulative bridging regions 126', 126" also interconnect the uppermost insulating layer 126 between adjacent ones of the contacts 128, 130 at several locations along the length of the trenches 106. In one embodiment, the field plate contacts 128 are each divided along the length of the trenches 106 into at least 10 field plate contact segments 128' that are separated from one another by first bridging regions 126' of the uppermost insulating layer 126 and the mesa contacts 130 are each similarly divided along the length of the trenches 106 into at least 10 mesa contact segments 130' that are separated from one another by second bridging regions 126" of the uppermost insulating layer 126.

The field plate contacts 128 may be divided into the field plate contact segments 128' at the same locations (aligned in y-direction in FIGS. 1 and 2) along the length (x-direction in FIGS. 1 and 2) of the trenches 106. In a similar manner, the mesa contacts 130 may be divided into the mesa contact segments 130' at the same locations (aligned in y-direction in FIGS. 1 and 2) along the length (x-direction in FIGS. 1 and 2) of the trenches 106. As shown in FIG. 2, the field plate contacts 128 and the mesa contacts 130 may be divided at the same locations (aligned in y-direction in FIGS. 1 and 2) along the length (x-direction in FIGS. 1 and 2) of the trenches 106, although the width of separation for the different types of contact segments 128', 130' may be different (d1 versus d2) as previously explained herein. In another embodiment, the field plate contacts 128 are divided into the field plate contact segments 128' at first locations along the length of the trenches 106 and the mesa contacts 130 are divided into the mesa contact segments 130' at second locations along the length of the trenches 106, wherein the first locations are different than the second locations. That is, the first and second locations may not be aligned in the y-direction in FIGS. 1 and 2.

In a first area 132 adjacent to an end 134 of the trenches 106, a first line (e.g. corresponding to cross-section line A-A' in FIG. 2) that runs perpendicular to the trenches 106 intersects the field plate contact segment 128' of each field plate contact 128 and the mesa contact segment 130' of each mesa contact 130 disposed closest to the end 134 of the trenches 106. In a second area 136 spaced inward from the first area 132, a second line (e.g. corresponding to cross-section line B-B' in FIG. 2) that runs perpendicular to the trenches 106 intersects a field plate contact segment 128' of each field plate contact 128 and a mesa contact segment 130' of each mesa contact 130.

The semiconductor mesas 110 confined by the trenches 106 include a source region 138 of a first conductivity type in the second area 136. The semiconductor mesas 110 may be devoid of the source region 138 in the first area 132. The mesa contact segments 130' located in the second area 136 contact the source region 138 of the semiconductor mesas 138. The mesa contact segments 130' located in the first area 132 extend from the first area 132 into the second area 136 and contact the source region 138 of the semiconductor mesas 110 in the second area 136 but not in the first area 132.

In one embodiment, the source region 138 of the semiconductor mesas 110 has gaps 140 in the second area 136 that are filled with semiconductor material 142 of a second conductivity type, e.g., a body region of the power transistor device 100. That is, the source region 138 may be interrupted or omitted in areas without a mesa contact 130, to avoid latch up during avalanche. For each mesa contact 130 divided into two or more mesa contact segments 130' over the length of the mesa contact 130, the gaps 140 in the source region 130 may be realized by blocking the implantation of a dopant used to form the source region 138 from a region of the semiconductor mesa 110 vertically aligned with a gap (represented by distance d2 in FIG. 2) between the mesa contact segments 130' of each mesa contact 130. The gaps 140 in the source region 130 may be realized by appropriate patterning of a lithography mask (not show) used during the source implantation, i.e., the source implantation is blocked by corresponding intact/blocking regions of the lithography mask.

The gaps 140 in the source region 138 may slightly increase the on resistance (RON) of the power transistor device 100. However, if the distance d2 between the mesa contact segments 130' is smaller than the distance d1 between the field plate contact segments 128', no RON disadvantage is expected. With the interruption of the contacts 128, 130, mechanical stability is increased.

The separation between the mesa contact segments 130' of the mesa contacts 130 may be vertically aligned with the gaps 140 in the source region 138 of the semiconductor mesas 110, e.g., as shown in FIGS. 2 and 7. The outline of the source region 138 is illustrated by as a single large dashed rectangle in FIG. 2 since the source region 138 would otherwise not be visible in this plan view. The gaps 140 in the source region 138 are similarly illustrated by smaller dashed rectangles in FIG. 2.

As shown in FIGS. 3 through 7, the trenches 106 extend depth-wise in a second direction (z-direction in FIGS. 3 through 7) perpendicular to the main surface 108 of the semiconductor substrate 104 and into a drift region 144 of the first conductivity type. The body region 142 of the second conductivity type separates the source region 138 from the drift region 144. A drain region 146 of the first conductivity type is disposed below the drift region 144 at the opposite side of the semiconductor substrate 104 as the source region 138. The first conductivity type is n-type and the second conductivity type is p-type in the case of an n-channel device. In the case of a p-channel device, the first conductivity type is p-type and the second conductivity type is n-type. As previously explained herein, the source region 138 may be omitted from the semiconductor mesas 110 in the first area 132 of the power semiconductor device 100 such that the mesa contact segments 130' closest to the corresponding end 134 of the trenches 106 extend from the first area 132 of the device 100 into the second area 136. A first part 130a' of the mesa contact segments 130' closest to the end 134 of the trenches 106 contact the body region 142 but not the source region 138 in the first area 132 of the power semiconductor device 100. A second part 130b' of the mesa contact segments 130' closest to the end 134 of the trenches 106 contact both the body region 142 and the source region 138 in the second area 136 of the power semiconductor device 100.

In one embodiment, an aspect ratio of the field plate contacts 128 is in a range between 5 and 30, wherein the aspect ratio being defined as a ratio of contact height to a bottom width of the field plate contacts 128. With such a high aspect ratio for the field plate contacts 128, and since the contacts 128, 130 extend over the length of the trenches 106, the forces on the uppermost insulating layer 126 would be very high during wire bonding unless the field plate contacts 128 and the mesa contacts 130 are divided into multiple spaced-apart segments 128', 130' along the length of the trenches 106, as described herein. The segmented contact array structure described herein increases the mechanical stability of the insulating layer 126 below the final (top) metallization layer 120 which includes the contact pads 124. By making the uppermost insulating layer 126 more stable, the final metallization layer 120 is also stabilized. The interruption length may vary as well as the interruption of the source implantation. Also, the location of the interruption of the contacts 128, 130 relative to each other may also vary. In one embodiment, only the field plate contacts 128 are interrupted. According to this embodiment, no RON disadvantage is expected but the improvement of the mechanical stability is less.

Although the present disclosure is not so limited, the following numbered examples demonstrate one or more aspects of the disclosure.

Example 1. A transistor device, comprising: a semiconductor substrate having a first surface; a plurality of trenches in the semiconductor substrate and extending lengthwise in parallel with one another in a first direction parallel to the first surface such that each pair of adjacent trenches confines a semiconductor mesa; a field electrode and a gate electrode disposed in each of the trenches; a final metallization layer above the semiconductor substrate and segmented into a plurality of contact pads; a plurality of field plate contacts extending lengthwise in parallel with one another in the first direction and electrically connecting the contact pads to the field electrodes; and a plurality of mesa contacts extending lengthwise in parallel with one another in the first direction and electrically connecting the contact pads to the semiconductor mesas, wherein the field plate contacts are each divided along the length of the trenches into a plurality of field plate contact segments that are separated from one another, wherein the mesa contacts are each divided along the length of the trenches into a plurality of mesa contact segments that are separated from one another, wherein in a first area adjacent to an end of the trenches, a first line that runs perpendicular to the trenches intersects a first field plate contact segment of the field plate contacts and a first mesa contact segment of the mesa contacts, wherein in a second area spaced inward from the first area, a second line that runs perpendicular to the trenches intersects a second field plate contact segment of the field plate contacts and a second mesa contact segment of the mesa contacts.

Example 2. The transistor device of example 1, wherein the semiconductor mesas include a source region of a first conductivity type in the second area and are devoid of the source region in the first area, and wherein the second mesa contact segments contact the source region of the semiconductor mesas in the second area.

Example 3. The transistor device of example 2, wherein the first mesa contact segments extend from the first area into the second area, and wherein the first mesa contact segments contact the source region of the semiconductor mesas in the second area but not in the first area.

Example 4. The transistor device of example 2 or 3, wherein the source region of the semiconductor mesas has gaps in the second area that are filled with semiconductor material of a second conductivity type, and wherein the separation between the mesa contact segments of the mesa contacts are vertically aligned with the gaps in the source region of the semiconductor mesas.

Example 5. The transistor device of any of examples 1 through 4, wherein the field plate contacts are each divided along the length of the trenches into at least 10 field plate contact segments that are separated from one another, and wherein the mesa contacts are each divided along the length of the trenches into at least 10 mesa contact segments that are separated from one another.

Example 6. The transistor device of any of examples 1 through 5, wherein the field plate contacts are divided into the field plate contact segments at the same locations along the length of the trenches.

Example 7. The transistor device of any of examples 1 through 6, wherein the mesa contacts are divided into the mesa contact segments at the same locations along the length of the trenches.

Example 8. The transistor device of any of examples 1 through 7, wherein the field plate contacts are divided into the field plate contact segments at first locations along the length of the trenches, wherein the mesa contacts are divided into the mesa contact segments at second locations along the length of the trenches, and wherein the first locations are different than the second locations.

Example 9. The transistor device of any of examples 1 through 8, wherein the plurality of trenches extends depthwise in a second direction perpendicular to the first surface into a drift region of a first conductivity type, wherein each semiconductor mesa includes a source region of the first conductivity type and a body region of a second conductivity type separating the source region from the drift region, and wherein the mesa contacts are in contact with the source regions.

Example 10. The transistor device of example 9, wherein the source region is omitted from the semiconductor mesas in the first area, wherein the mesa contact segments closest to the end of the trenches extend from the first area into the second area, and wherein a first part of the mesa contact segments closest to the end of the trenches contact the body region but not the source region in the first area and a second part of the mesa contact segments closest to the end of the trenches contact both the body region and the source region in the second area.

Example 11. The transistor device of any of examples 1 through 10, wherein the field plate contact segments of the same field plate contact are separated from one another by first regions of an electrically insulative material, wherein the mesa contact segments of the same mesa contact are separated from one another by second regions of the electrically insulative material, and wherein the first regions of the electrically insulative material are wider than the second regions of the electrically insulative material.

Example 12. The transistor device of any of examples 1 through 11, wherein the field plate contact segments of the same field plate contact are separated from one another by a first distance, and wherein the mesa contact segments of the same mesa contact are separated from one another by a second distance smaller than the first distance.

Example 13. The transistor device of any of examples 1 through 12, wherein an aspect ratio of the field plate contacts is in a range between 5 and 30, and wherein the aspect ratio is defined as a ratio of contact height to a bottom width of the field plate contacts.

Example 14. A method of producing a transistor device, the method comprising: forming a plurality of trenches in a semiconductor substrate and extending lengthwise in parallel with one another in a first direction parallel to a first surface of the semiconductor substrate such that each pair of adjacent trenches confines a semiconductor mesa; forming a field electrode and a gate electrode in each of the trenches; forming a final metallization layer above the semiconductor substrate and segmented into a plurality of contact pads; forming a plurality of field plate contacts that extend lengthwise in parallel with one another in the first direction and electrically connect the contact pads to the field electrodes; and forming a plurality of mesa contacts that extend lengthwise in parallel with one another in the first direction and electrically connect the contact pads to the semiconductor mesas, wherein forming the plurality of field plate contacts comprises dividing each field plate contact along the length of the trenches into a plurality of field plate contact segments that are separated from one another, wherein forming the plurality of mesa contacts comprises dividing each mesa contact along the length of the trenches into a plurality of mesa contact segments that are separated from one another, wherein in a first area adjacent to an end of the trenches, a first line that runs perpendicular to the trenches intersects a first field plate contact segment of the field plate contacts and a first mesa contact segment of the mesa contacts, wherein in a second area spaced inward from the first area, a second line that runs perpendicular to the trenches intersects a second field plate contact segment of the field plate contacts and a second mesa contact segment of the mesa contacts.

Example 15. The method of example 14, wherein the semiconductor mesas include a source region of a first conductivity type in the second area and are devoid of the source region in the first area, and wherein the second mesa contact segments contact the source region of the semiconductor mesas in the second area.

Example 16. The method of example 15, wherein the first mesa contact segments extend from the first area into the second area, and wherein the first mesa contact segments contact the source region of the semiconductor mesas in the second area but not in the first area.

Example 17. The method of example 15 or 16, wherein the source region of the semiconductor mesas has gaps in the second area that are filled with semiconductor material of a second conductivity type, the method further comprising: vertically aligning the separation between the mesa contact segments of the mesa contacts with the gaps in the source region of the semiconductor mesas.

Example 18. The method of any of examples 14 through 17, wherein the plurality of trenches extends depth-wise in a second direction perpendicular to the first surface into a drift region of a first conductivity type, the method further comprising: forming a source region of the first conductivity type and a body region of a second conductivity type in each semiconductor mesa, the body region separating the source region from the drift region, the mesa contacts being in contact with the source regions; omitting the source region from the semiconductor mesas in the first area; and for the mesa contact segments closest to the end of the trenches and extending from the first area into the second area, contacting a first part of the mesa contact segments to the body region but not the source region in the first area and contacting a second part of the mesa contact segments to both the body region and the source region in the second area.

Example 19. The method of any of examples 14 through 18, further comprising: separating the field plate contact segments of the same field plate contact from one another by first regions of an electrically insulative material; and separating the mesa contact segments of the same mesa contact from one another by second regions of the electrically insulative material, wherein the first regions of the electrically insulative material are wider than the second regions of the electrically insulative material.

Example 20. The method of any of examples 14 through 19, further comprising: separating the field plate contact segments of the same field plate contact from one another by a first distance; and separating the mesa contact segments of the same mesa contact from one another by a second distance smaller than the first distance.

Example 21. A transistor device, comprising: a semiconductor substrate having a first surface; a plurality of trenches in the semiconductor substrate and extending lengthwise in parallel with one another in a first direction parallel to the first surface such that each pair of adjacent trenches confines a semiconductor mesa; a field electrode and a gate electrode disposed in each of the trenches; a final metallization layer above the semiconductor substrate and segmented into a plurality of contact pads; a plurality of field plate contacts extending lengthwise in parallel with one another in the first direction and electrically connecting the contact pads to the field electrodes; and a plurality of mesa contacts extending lengthwise in parallel with one another in the first direction and electrically connecting the contact pads to the semiconductor mesas, wherein the field plate contacts are each divided along the length of the trenches into a plurality of field plate contact segments that are separated from one another, wherein in a first area adjacent to an end of the trenches, a first line that runs perpendicular to the trenches intersects a first field plate contact segment of the field plate contacts, wherein in a second area spaced inward from the first area, a second line that runs perpendicular to the trenches intersects a second field plate contact segment of the field plate contacts.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
    a semiconductor substrate having a first surface;
    a plurality of trenches in the semiconductor substrate and extending lengthwise in parallel with one another in a first direction parallel to the first surface such that each pair of adjacent trenches of the plurality of trenches confines a semiconductor mesa;
    a field electrode and a gate electrode disposed in each of the plurality of trenches;
    a final metallization layer above the semiconductor substrate and segmented into a plurality of contact pads;
    a plurality of field plate contacts extending lengthwise in parallel with one another in the first direction and electrically connecting the plurality of contact pads to the field electrodes; and
    a plurality of mesa contacts extending lengthwise in parallel with one another in the first direction and electrically connecting the plurality of contact pads to the semiconductor mesas,
    wherein the plurality of field plate contacts are each divided along the length of the plurality of trenches into a plurality of field plate contact segments that are separated from one another,
    wherein the plurality of mesa contacts are each divided along the length of the plurality of trenches into a plurality of mesa contact segments that are separated from one another,
    wherein in a first area adjacent to an end of the plurality of trenches, a first line that runs perpendicular to the plurality of trenches intersects a first field plate contact segment of the plurality of field plate contacts and a first mesa contact segment of the plurality of mesa contacts,
    wherein in a second area spaced inward from the first area, a second line that runs perpendicular to the plurality of trenches intersects a second field plate contact segment of the plurality of field plate contacts and a second mesa contact segment of the plurality of mesa contacts.

2. The transistor device of claim 1, wherein the semiconductor mesas include a source region of a first conductivity type in the second area and are devoid of the source region in the first area, and wherein the second mesa contact segments contact the source region of the semiconductor mesas in the second area.

3. The transistor device of claim 2, wherein the first mesa contact segments extend from the first area into the second area, and wherein the first mesa contact segments contact the source region of the semiconductor mesas in the second area but not in the first area.

4. The transistor device of claim 2, wherein the source region of the semiconductor mesas has gaps in the second area that are filled with semiconductor material of a second conductivity type, and wherein the separation between the plurality of mesa contact segments of the plurality of mesa contacts are vertically aligned with the gaps in the source region of the semiconductor mesas.

5. The transistor device of claim 1, wherein the plurality of field plate contacts are each divided along the length of the plurality of trenches into at least 10 field plate contact segments that are separated from one another, and wherein the plurality of mesa contacts are each divided along the length of the plurality of trenches into at least 10 mesa contact segments that are separated from one another.

6. The transistor device of claim 1, wherein the plurality of field plate contacts are divided into the plurality of field plate contact segments at the same locations along the length of the plurality of trenches.

7. The transistor device of claim 1, wherein the plurality of mesa contacts are divided into the plurality of mesa contact segments at the same locations along the length of the plurality of trenches.

8. The transistor device of claim 1, wherein the plurality of field plate contacts are divided into the plurality of field plate contact segments at first locations along the length of the plurality of trenches, wherein the plurality of mesa contacts are divided into the plurality of mesa contact segments at second locations along the length of the plurality of trenches, and wherein the first locations are different than the second locations.

9. The transistor device of claim 1, wherein the plurality of trenches extends depth-wise in a second direction perpendicular to the first surface into a drift region of a first conductivity type, wherein each semiconductor mesa includes a source region of the first conductivity type and a body region of a second conductivity type separating the source region from the drift region, and wherein the plurality of mesa contacts are in contact with the source regions.

10. The transistor device of claim 9, wherein the source region is omitted from the semiconductor mesas in the first area, wherein the plurality of mesa contact segments closest to the end of the plurality of trenches extend from the first area into the second area, and wherein a first part of the plurality of mesa contact segments closest to the end of the plurality of trenches contact the body region but not the source region in the first area and a second part of the plurality of mesa contact segments closest to the end of the plurality of trenches contact both the body region and the source region in the second area.

11. The transistor device of claim 1, wherein the plurality of field plate contact segments of the same field plate contact are separated from one another by first regions of an electrically insulative material, wherein the plurality of mesa contact segments of the same mesa contact are separated from one another by second regions of the electrically insulative material, and wherein the first regions of the electrically insulative material are wider than the second regions of the electrically insulative material.

12. The transistor device of claim 1, wherein the plurality of field plate contact segments of the same field plate contact are separated from one another by a first distance, and wherein the plurality of mesa contact segments of the same mesa contact are separated from one another by a second distance smaller than the first distance.

13. The transistor device of claim 1, wherein an aspect ratio of the plurality of field plate contacts is in a range between 5 and 30, and wherein the aspect ratio is defined as a ratio of contact height to a bottom width of the plurality of field plate contacts.

14. A method of producing a transistor device, the method comprising:
forming a plurality of trenches in a semiconductor substrate and extending lengthwise in parallel with one another in a first direction parallel to a first surface of the semiconductor substrate such that each pair of adjacent trenches of the plurality of trenches confines a semiconductor mesa;
forming a field electrode and a gate electrode in each of the plurality of trenches;
forming a final metallization layer above the semiconductor substrate and segmented into a plurality of contact pads;
forming a plurality of field plate contacts that extend lengthwise in parallel with one another in the first direction and electrically connect the plurality of contact pads to the field electrodes; and
forming a plurality of mesa contacts that extend lengthwise in parallel with one another in the first direction and electrically connect the plurality of contact pads to the semiconductor mesas,
wherein forming the plurality of field plate contacts comprises dividing each field plate contact along the length of the plurality of trenches into a plurality of field plate contact segments that are separated from one another,
wherein forming the plurality of mesa contacts comprises dividing each mesa contact along the length of the plurality of trenches into a plurality of mesa contact segments that are separated from one another,
wherein in a first area adjacent to an end of the plurality of trenches, a first line that runs perpendicular to the plurality of trenches intersects a first field plate contact segment of the plurality of field plate contacts and a first mesa contact segment of the plurality of mesa contacts,
wherein in a second area spaced inward from the first area, a second line that runs perpendicular to the plurality of trenches intersects a second field plate contact segment of the plurality of field plate contacts and a second mesa contact segment of the plurality of mesa contacts.

15. The method of claim 14, wherein the semiconductor mesas include a source region of a first conductivity type in the second area and are devoid of the source region in the first area, and wherein the second mesa contact segments contact the source region of the semiconductor mesas in the second area.

16. The method of claim 15, wherein the first mesa contact segments extend from the first area into the second area, and wherein the first mesa contact segments contact the source region of the semiconductor mesas in the second area but not in the first area.

17. The method of claim 15, wherein the source region of the semiconductor mesas has gaps in the second area that are filled with semiconductor material of a second conductivity type, the method further comprising:
vertically aligning the separation between the plurality of mesa contact segments of the plurality of mesa contacts with the gaps in the source region of the semiconductor mesas.

18. The method of claim 14, wherein the plurality of trenches extends depth-wise in a second direction perpendicular to the first surface into a drift region of a first conductivity type, the method further comprising:
forming a source region of the first conductivity type and a body region of a second conductivity type in each semiconductor mesa, the body region separating the source region from the drift region, the plurality of mesa contacts being in contact with the source regions;
omitting the source region from the semiconductor mesas in the first area; and
for the plurality of mesa contact segments closest to the end of the plurality of trenches and extending from the first area into the second area, contacting a first part of the plurality of mesa contact segments to the body region but not the source region in the first area and contacting a second part of the plurality of mesa contact segments to both the body region and the source region in the second area.

19. The method of claim 14, further comprising:
separating the plurality of field plate contact segments of the same field plate contact from one another by first regions of an electrically insulative material; and
separating the plurality of mesa contact segments of the same mesa contact from one another by second regions of the electrically insulative material,
wherein the first regions of the electrically insulative material are wider than the second regions of the electrically insulative material.

20. The method of claim 14, further comprising:
separating the plurality of field plate contact segments of the same field plate contact from one another by a first distance; and
separating the plurality of mesa contact segments of the same mesa contact from one another by a second distance smaller than the first distance.

21. A transistor device, comprising:
a semiconductor substrate having a first surface;
a plurality of trenches in the semiconductor substrate and extending lengthwise in parallel with one another in a first direction parallel to the first surface such that each pair of adjacent trenches of the plurality of trenches confines a semiconductor mesa;
a field electrode and a gate electrode disposed in each of the plurality of trenches;
a final metallization layer above the semiconductor substrate and segmented into a plurality of contact pads;
a plurality of field plate contacts extending lengthwise in parallel with one another in the first direction and electrically connecting the plurality of contact pads to the field electrodes; and a plurality of mesa contacts extending lengthwise in parallel with one another in the first direction and electrically connecting the plurality of contact pads to the semiconductor mesas, wherein the plurality of field plate contacts are each divided along the length of the plurality of trenches into a plurality of field plate contact segments that are separated from one another, wherein in a first area adjacent to an end of the plurality of trenches, a first line that runs perpendicular to the plurality of trenches intersects a first field plate contact segment of the plurality of field plate contacts, wherein in a second area spaced inward from the first area, a second line that runs perpendicular to the plurality of trenches intersects a second field plate contact segment of the plurality of field plate contacts.

\* \* \* \* \*